United States Patent
Chamberlain et al.

[11] Patent Number: 5,981,933
[45] Date of Patent: Nov. 9, 1999

[54] CCD SENSOR WITH DIAGONAL HEAT CONDUCTING STRAPS

[75] Inventors: Savvas G. Chamberlain, Waterloo; Stacy R. Kamasz, Kitchener; Simon G. Ingram, Waterloo, all of Canada

[73] Assignee: Dalsa, Inc., Canada

[21] Appl. No.: 09/010,680

[22] Filed: Jan. 22, 1998

Related U.S. Application Data

[60] Provisional application No. 60/056,400, Aug. 26, 1997.

[51] Int. Cl.$^6$ ........................................... H04N 3/15
[52] U.S. Cl. .................. 250/208.1; 250/238; 250/214.1; 348/295
[58] Field of Search ................................. 250/208.1, 238, 250/352, 214.1; 348/295; 257/232

[56] References Cited

U.S. PATENT DOCUMENTS

| | | | |
|---|---|---|---|
| 3,103,587 | 9/1963 | Ure, Jr. et al. | 250/352 |
| 3,188,476 | 6/1965 | Karmiggelt et al. | 250/214.1 |
| 3,227,885 | 1/1966 | Hirai et al. | 250/238 |
| 3,389,267 | 6/1968 | Aconsky | 250/238 |
| 3,449,580 | 6/1969 | Heimann et al. | 250/214.1 |
| 4,209,347 | 6/1980 | Klein | 136/246 |
| 4,375,652 | 3/1983 | White | 348/295 |
| 5,332,031 | 7/1994 | Kiga | 165/86 |
| 5,596,228 | 1/1997 | Anderton et al. | 257/714 |

*Primary Examiner*—Edward P. Westin
*Assistant Examiner*—Thanh X. Luu
*Attorney, Agent, or Firm*—Banner & Witcoff, Ltd.

[57] ABSTRACT

A CCD structure includes a substrate in which a plurality of buried channels have been formed and a heat conductor disposed transversely to the buried channels and defining a longitudinal direction. A first channel defines a channel direction. The heat conductor includes a first segment and a second segment separated by a gap from the first segment. The heat conductor further includes a tab connected to the first segment. In the structure the tab is characterized by an extent along a direction parallel to the longitudinal direction that is equal to an extent of the gap along the longitudinal direction, an extent along a direction perpendicular to the longitudinal direction that is equal to a width of the heat conductor, and a shape that is a parallelogram, preferably a rectangle. In the structure the gap is characterized by a gap predetermined shape, size and orientation, and the tab is characterized by a tab predetermined shape, size and orientation. The tab predetermined shape, size and orientation is equal to the gap predetermined shape, size and orientation, respectively.

34 Claims, 6 Drawing Sheets

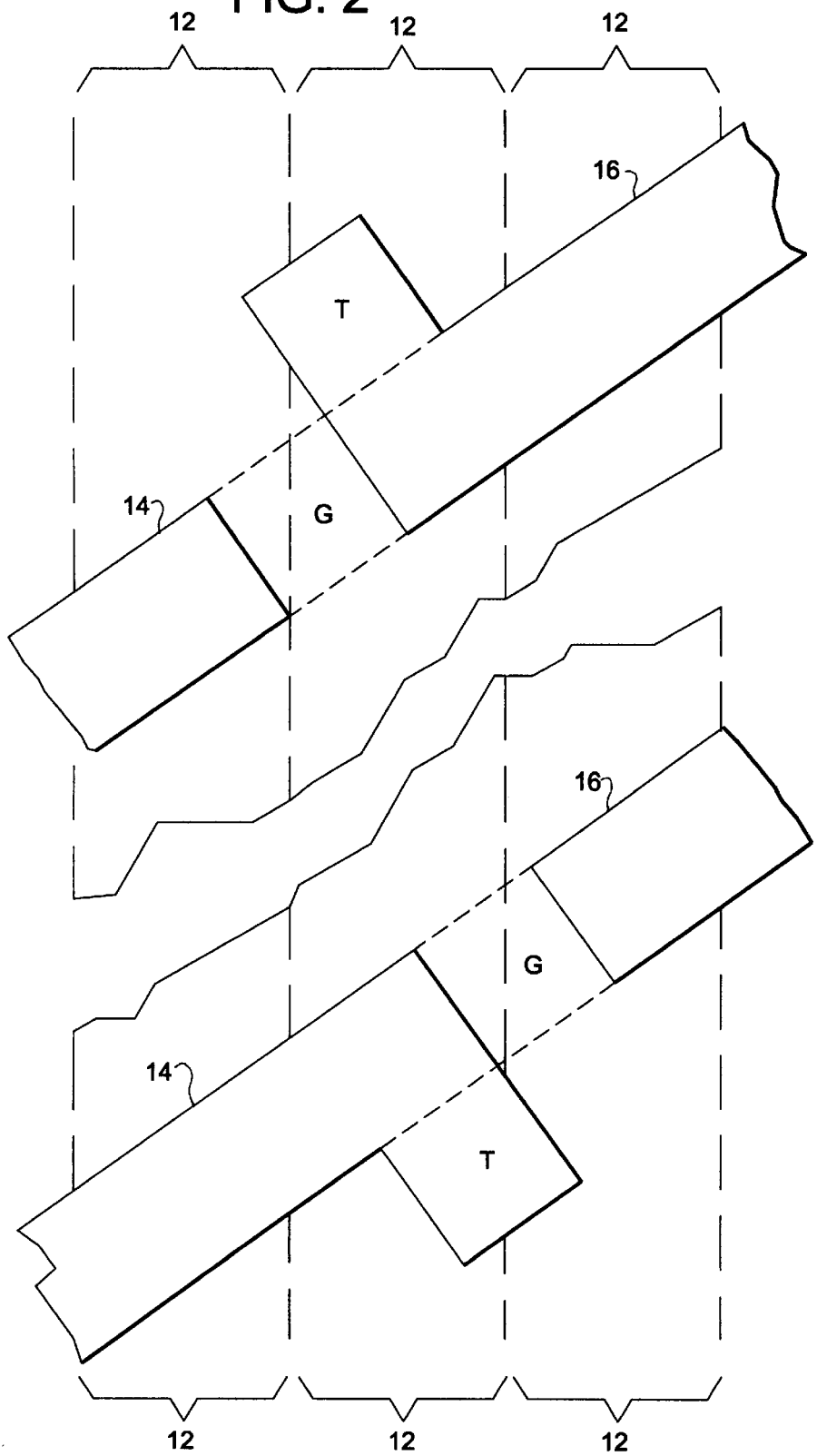

CCD SENSOR WITH DIAGONAL HEAT CONDUCTING STRAPS

The priority benefit of the filing date of Ser. No. 60/056,400, filed Aug. 26, 1997 is hereby claimed.

BACKGROUND OF THE INVENTION

1. Field of the Invention

The present invention relates to time delay and integrate (TDI) charge coupled device (CCD) sensors. In particular, the invention relates to discontinuous diagonal heat conducting straps on TDI CCD sensors to remove heat, a tab being included at each discontinuity to compensate for the extra illumination through the gap of the discontinuity.

2. Description of Related Art

Charge coupled devices (hereinafter CCDs) are widely used in video imaging and inspection applications. For example, a CCD sensor may be applied to industrial inspection or vision equipment. Inspection cameras used to inspect moving objects (e.g., on a continuous conveyor belt or rolled goods such as rolls of cloth) employ a line scan CCD sensor where a linear CCD sensor is oriented in a direction perpendicular to the direction of movement of the object being imaged. Advanced linear CCD sensors often employ a time delay and integrate technology and are referred to as TDI CCD sensors.

In FIG. 8, known time delay and integrate (TDI) linear array sensor 2 includes imaging section 4 coupled to horizontal CCD readout shift register 6. Imaging section 4 includes a plurality of columns, each column including a plurality of photo-sites. In operation, a camera lens focuses the image on the TDI CCD sensor. The image, that is the optical input to the TDI CCD sensor, is moving (e.g., on a conveyor belt). An image conjugate focused on the sensor appears to be moving. A portion of the image first appears on one pixel of the TDI CCD sensor, and then appears on another pixel of the sensor. The camera and sensor are arranged so that a portion of the moving image moves in a direction from the top of column 8 of photo-sites to the bottom of column 8 (adjacent to horizontal readout shift register 6). The TDI CCD sensor is clocked to transfer charge down the columns of photo-sites at a rate equal to the rate that the portion of the image moves down the column. Charge generated at a first photo-site is transferred to the next photo-site at the same time that the image portion that generated the charge at the first photo-site moves to the next photo-site. In this way photo-charge is accumulated at the photo-site under the image portion as the image portion moves down the column. Thus the name, time delay and integrate (TDI).

In a TDI CCD sensor, the last pixel in each integrating column (e.g., column 8) of photo-sites (i.e., the last horizontal line) is transferred into a horizontal CCD readout shift register. The line of data is then transferred serially through an output node structure at the end of the register and then through a buffer amplifier.

Imaging section 4 includes a plurality of such integrating columns. Disposed over, and insulated from, the columns is a plurality of sets of clock driving lines, one clock driving line in each set is for a corresponding phase of the clock system. To transfer signal charges vertically in each column, clocking signals are applied to corresponding clock driving lines in each set of clock driving lines. The clock driving lines are typically formed of doped poly-crystalline silicon and are characterized by a high resistance "per square" when compared to metal. Thus, metal strapping is sometimes employed over the poly-crystalline silicon lines to provide a low resistance shunt for the clock signals to provide a more even distribution of clock signals over the entire area of imaging section 4.

U.S. Pat. No. 4,375,652 to White describes a time delay and integrate scanner with opaque metal conductors extending diagonally across the light receiving surface of the array to apply control signals.

However, in high density, large format CCD sensors, significant heat can build up in the center of the array unless a means is provided to remove the heat. Known heat removal means rely on conduction through the substrate of the CCD sensor. Heat that is not removed causes dark signal noise to be inserted in "hot" pixels. In fact, warmer pixels will experience more dark signal noise than will cooler pixels. To produce a quality image, it is necessary to provide uniform thermal as well as electrical and optical performance across the entire imaging area of the sensor.

SUMMARY OF THE INVENTION

It is an object to the present invention to provide a structure to remove heat from a CCD sensor. It is a further object of the present invention to provide a structure with metal (or other material) conductors that are discontinuous to enable separate electrical signals to be carried on the separate conductor segments. It is yet another object to the present invention to provide a structure with discontinuous metal conductor that have tabs to provide a uniform illumination fill factor.

These and other objects are achieved in a CCD structure that includes a substrate in which a plurality of buried channels have been formed and a heat conductor disposed transversely to the buried channels and defining a longitudinal direction. A first channel defines a channel direction. The heat conductor includes a first segment and a second segment separated by a gap from the first segment. The heat conductor further includes a tab connected to the first segment. In the structure the tab is characterized by an extent along a direction parallel to the longitudinal direction that is equal to an extent of the gap along the longitudinal direction, an extent along a direction perpendicular to the longitudinal direction that is equal to a width of the heat conductor, and a shape that is a parallelogram, preferably a rectangle. In the structure the gap is characterized by a gap predetermined shape, size and orientation, and the tab is characterized by a tab predetermined shape, size and orientation. The tab predetermined shape, size and orientation is equal to the gap predetermined shape, size and orientation, respectively.

BRIEF DESCRIPTION OF DRAWINGS

The invention will be described in detail in the following description of preferred embodiments with reference to the following figures wherein:

FIGS. 2–7 are alternative layout diagrams of a gap structures according to the present invention.

DETAILED DESCRIPTION OF PREFERRED EMBODIMENTS

Figure 1:
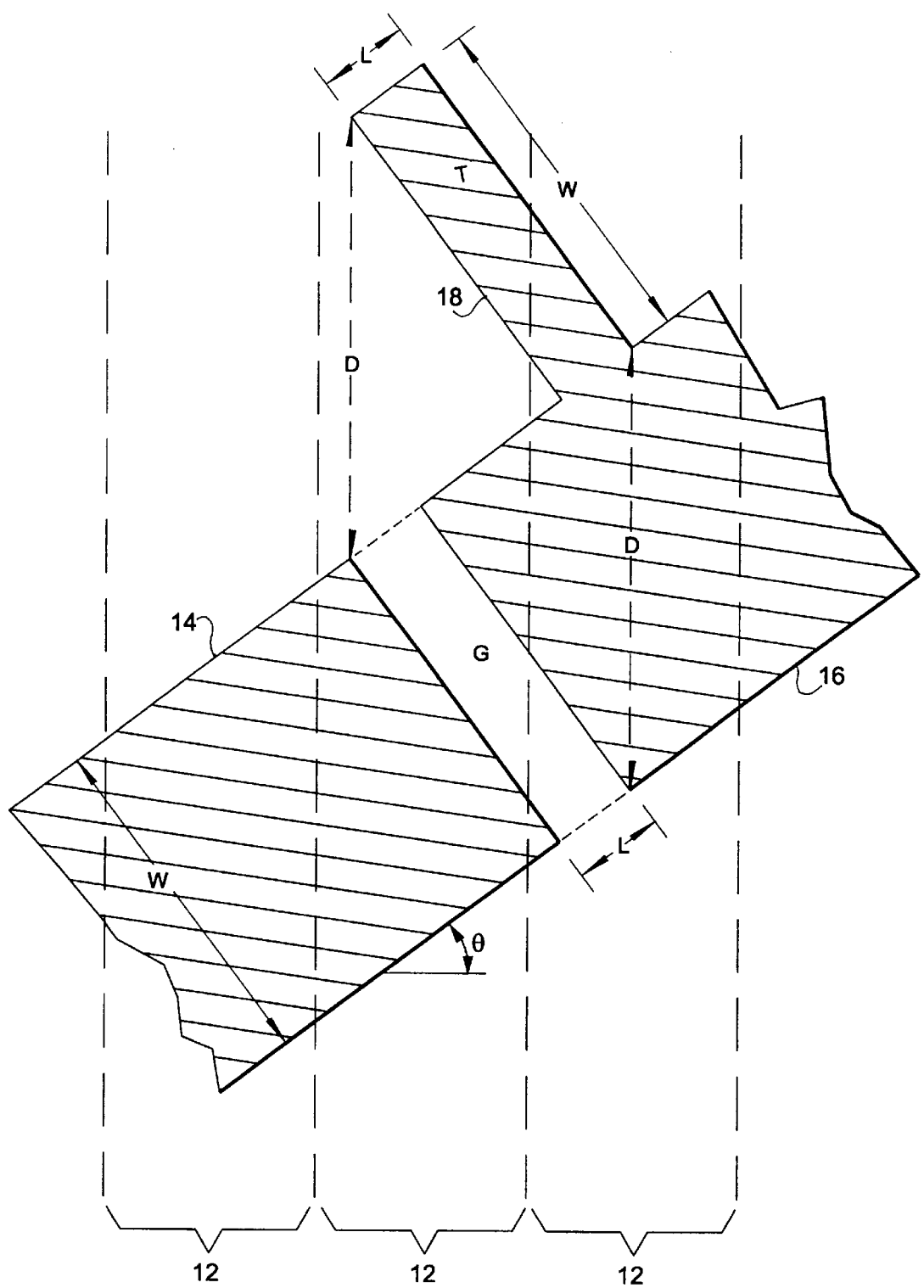
FIG. 1 is a layout diagram of a gap structure according to the present invention.

A charge coupled device image sensor may be designed to be operated in a time delay and integrate (TDI) mode. A set of diagonal metal straps may be used in the imaging section to conduct the heat away from the center of the imaging section. The metal straps connect to the underlying poly-crystalline silicon conductors that form the gates of the vertical CCD registers and serve as a heat sink. When the vertical columns are clocked, clock signals must alternately charge and discharge the capacitance between the gates and the substrate. In doing so, the clock signals dissipate heat in the resistive poly-crystalline silicon conductors. By contacting the poly-crystalline silicon conductors with the metal straps, heat is efficiently transferred to the metal straps. This reduces the temperature of the imaging pixels and consequently reduces dark charge generation. The metal straps provide a path of low thermal resistance to the periphery of the imaging area where the heat may be more easily removed. For example, once the heat is conducted to the periphery (e.g., conducted to a metal film in the shape of a ring surrounding or partially surrounding the imaging section), metal contacts of many forms may conduct heat out of the sensor package.

The metal straps are also used to carry clocking signals to the poly-crystalline silicon conductors. However, the metal ring at the periphery would ordinarily form a short circuit between a conductor carrying one phase clocking signal and a conductor carrying any other phase clocking signal. Thus, there is a need to electrically isolate electrical conductors (e.g., metal straps) used to carry different clocking signals.

A discontinuous metal strap with a gap serves to electrically isolate one side of the gap from the other side of the gap. For small gaps, heat still transfers across the gap through adjacent materials (e.g., electrical insulation oxides and poly-crystalline silicon) although with some loss in thermal conductivity. However, the gap blocks conduction of electrical clock signals. By suitable placement of gaps, electrical conductors (e.g., metal straps) used to carry different clocking signals may be isolated.

Some of the imaging pixels will be completely or partially covered by the metal straps disposed diagonally across the imaging section. The uniformity of the response in each vertical column can be maintained across the sensor when the total effective coverage by metal straps for each TDI vertical column is maintained constant. If each vertical column is traversed by, for example, six metal straps, all vertical columns will be covered by an equal amount of metal straps. The shadow effect from the metal straps would be evenly distributed across the columns. The sensor's overall sensitivity to light is reduce by the percentage of coverage, but the uniformity of the response is maintained.

However, a gap in a metal strap in the imaging section would permit extra light in the region of the gap to penetrate to the photo-sensitive region of the pixel. This increases the responsivity of the vertical column under the gap compared to the other vertical columns. The present invention includes a tab structure to compensate for the extra light impinging the pixel or pixels under the gap.

With the present invention, gaps with compensating tabs may be included in metal straps in the imaging section to provide electrical isolation while permitting thermal conduction to the periphery of the sensor.

In FIG. 1, a CCD sensor is formed in a substrate having a plurality of buried channels 12 defining a channel direction. Poly-crystalline silicon conductors are insulatively spaced from the channels and disposed substantially perpendicular to the channel direction. A heat conducting metal strap, of width W, is disposed above and spaced from the poly-crystalline silicon conductors and diagonally across the buried channels so as to define a longitudinal direction, the longitudinal direction being arbitrarily inclined at an angle θ with respect to the direction of the poly-crystalline silicon conductors.

Gap G is formed in the heat conduction metal strap to define first segment 14 and second segment 16 separated by the gap, gap G being of length L and width W. Tab T at 18, also of length L and width W, is connected to second segment 16. Tab T is of identical size, shape and orientation as gap G; however, tab T is displaced in the channel direction by a distance D so that it exactly abuts second segment 16 without overlap or additional gap. From geometry, D is equal to W times the secant of θ.

The design rules for any manufacturing process establishes minimum line widths, etc. While the distance L may be a minimum according to the design rules yet long enough to ensure electrical isolation, the width W is not so constrained. Width W may be defined wide according to the need for heat conduction or electrical conduction, or electrical circuit connection when the metal straps are used to carry clock signals or other signals.

In FIG. 2, a minimum width configuration is depicted with tab T above second section 16. In FIG. 3, a minimum width configuration is depicted with tab T below first section 14. Either configuration is equally effective. In fact, if the metal straps are consecutively number, even numbered straps may be configured as in FIG. 2 and odd numbered straps configured as in FIG. 3. This provides the opportunity to interdigitate the tabs if the gap locations are located opposite to each other. The straps may be disposed closer together to improve heat transfer efficiently.

Figure 4:
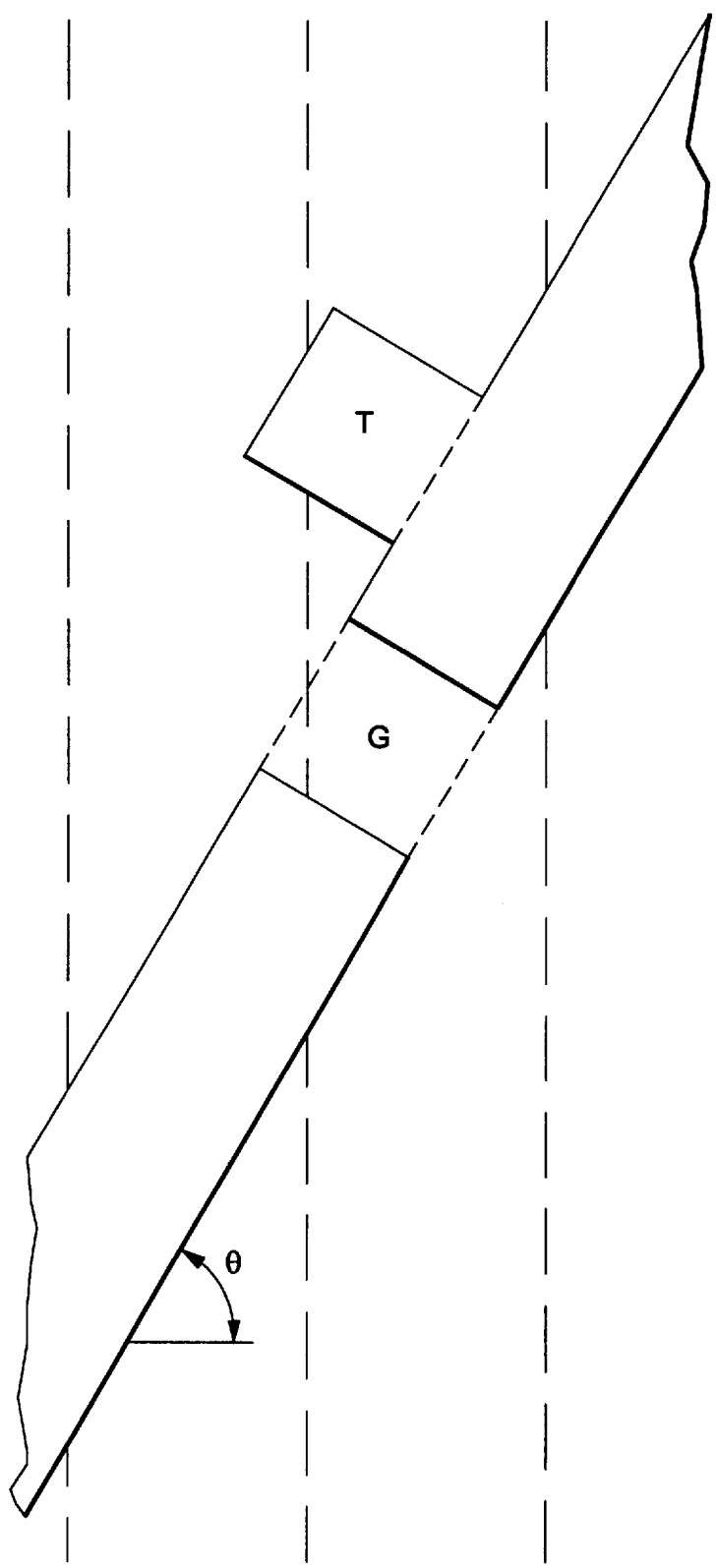

In FIG. 4, the gap structure is characterized by inclination angle θ of the metal strap that is greater than 45 degrees. In fact, the inclination angle may be at any angle between zero and 90 degrees.

Figure 5:
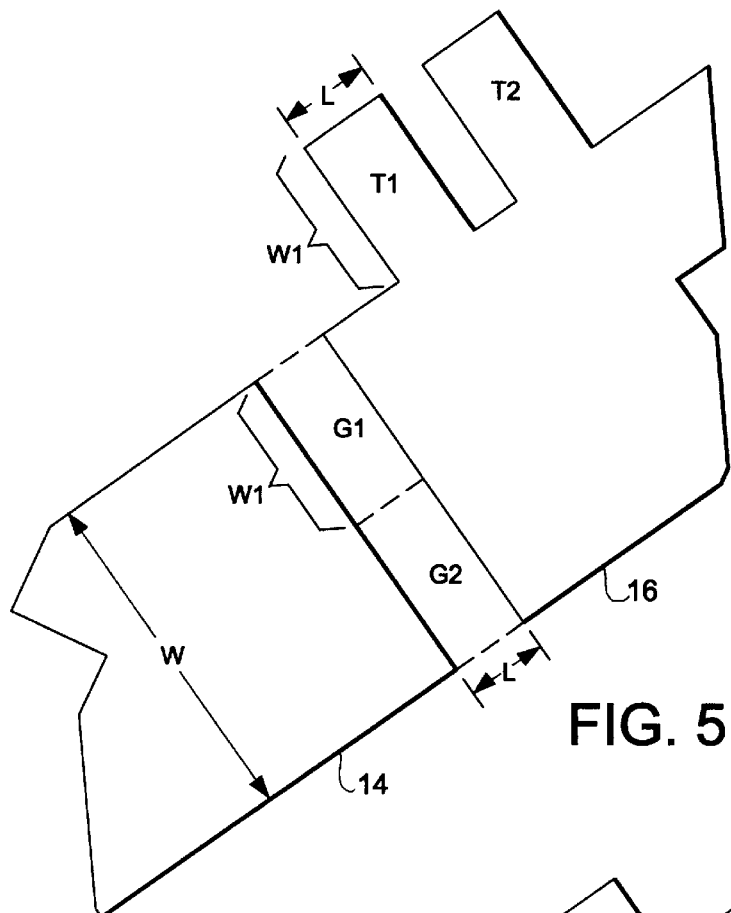

In FIG. 5, the gap structure includes gap G being defined as two sub-gaps G1 and G2. Compensating for gap G1 is tab T1 of the same size, shape and orientation, but displaced so as to abut an edge of second segment 16. Similarly, compensating for gap G2 is tab T2 of the same size, shape and orientation, but displaced so as to abut an edge of second segment 16. Note that the displacement distances of tabs T1 and T2 are different.

Figure 6:
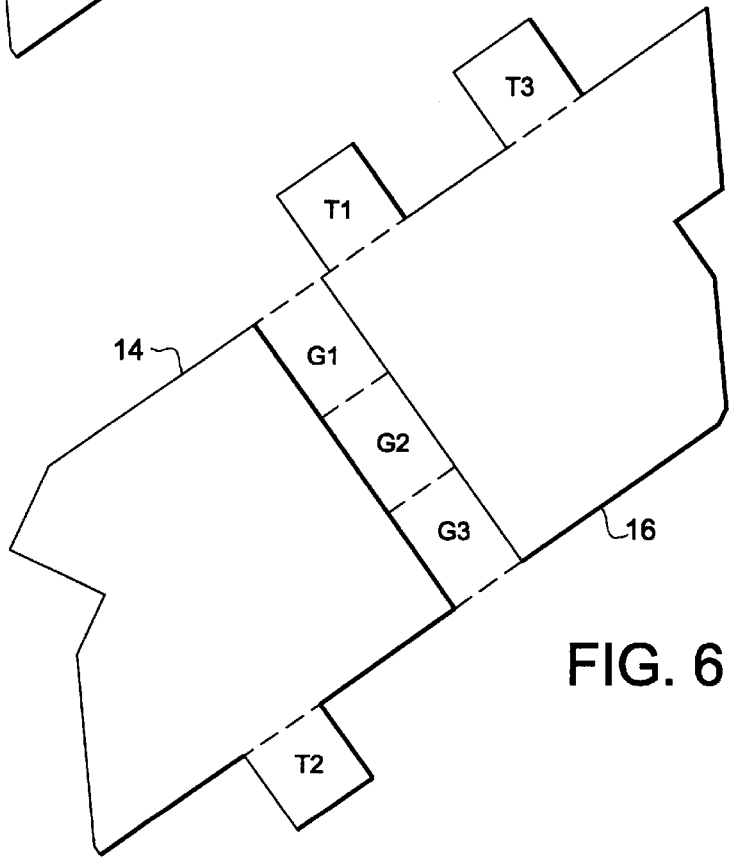

In FIG. 6, the gap structure includes gap G being defined as three sub-gaps G1, G2 and G3. Compensating for gap G1 is tab T1 of the same size, shape and orientation, but displaced up so as to abut an edge of second segment 16. Similarly, compensating for gap G2 is tab T2 of the same size, shape and orientation, but displaced down so as to abut an edge of first segment 14. Compensating for gap G3 is tab T3 of the same size, shape and orientation, but displaced up so as to abut an edge of second segment 16. Note that the displacement distances of tabs T1, T2 and T3 are, in general, different.

Figure 7:
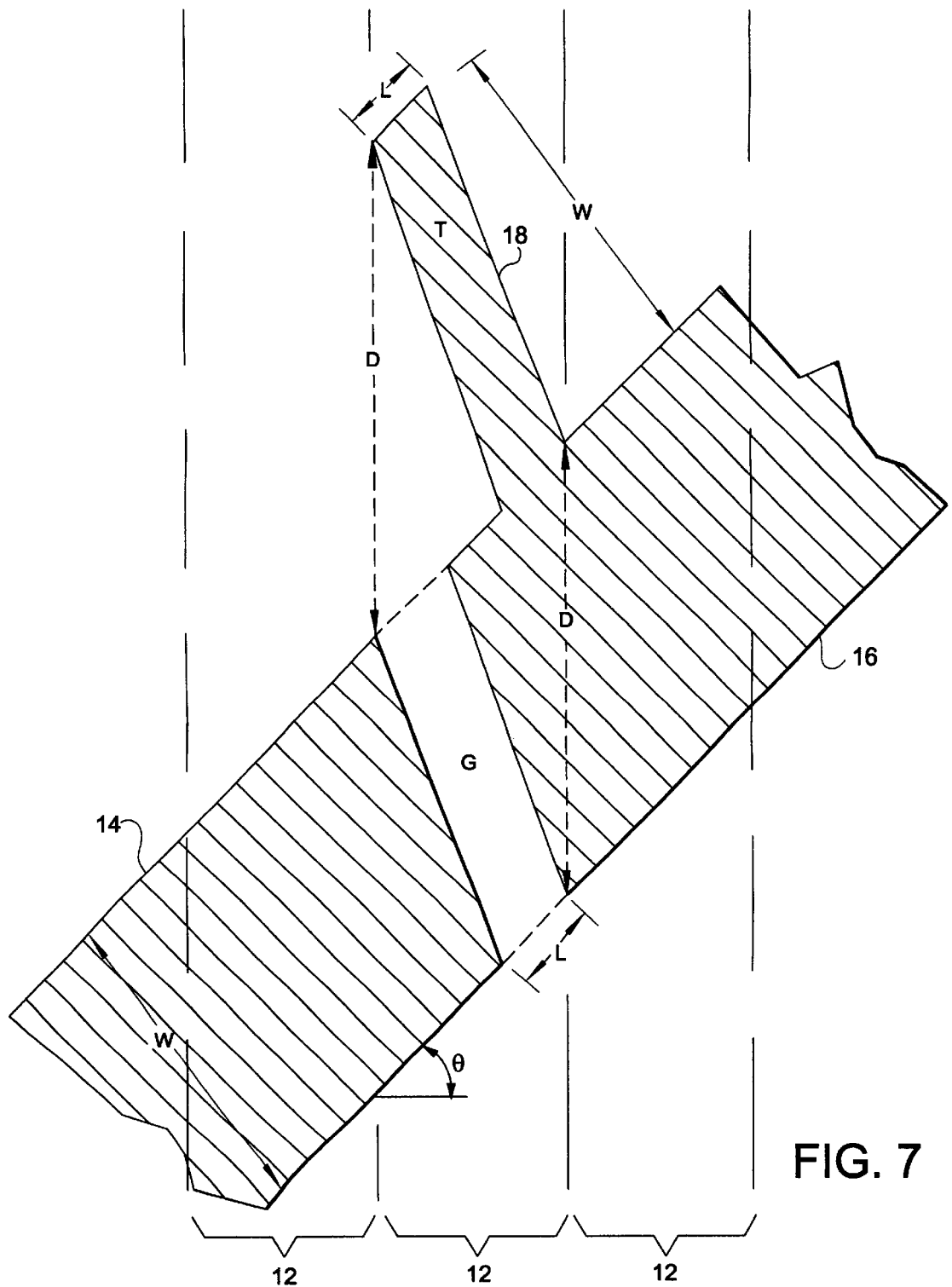
Figure 8:
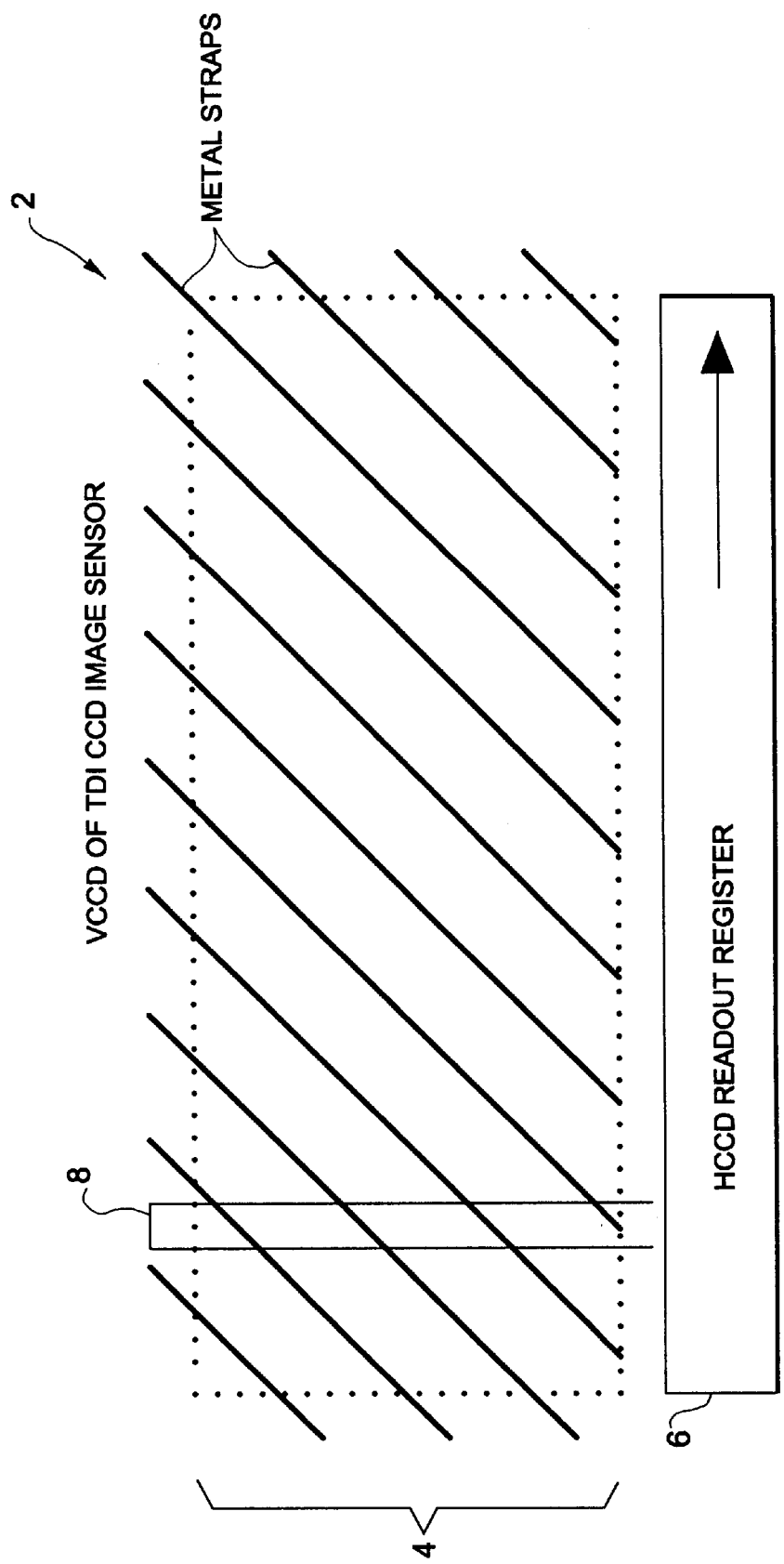
FIG. 8 is a layout diagram of a known sensor layouts.

In FIG. 7, a CCD sensor is formed in a substrate having a plurality of buried channels 12 defining a channel direction. Poly-crystalline silicon conductors are insulatively spaced from the channels and disposed substantially perpendicular to the channel direction. A heat conducting metal strap, of width W, is disposed above and spaced from the poly-crystalline silicon conductors and diagonally across the buried channels so as to define a longitudinal direction, the longitudinal direction being arbitrarily inclined at an angle θ with respect to the direction of the poly-crystalline silicon conductors.

Gap G is formed in the heat conduction metal strap to define first segment 14 and second segment 16 separated by the gap, gap G being of a non-rectangular parallelogram shape of length L and height W. Tab T at 18, also a parallelogram of length L and height W, is connected to second segment 16. Tab T is of identical size, shape and orientation as gap G; however, tab T is displaced in the channel direction by a distance D so that it exactly abuts second segment 16 without overlap or additional gap.

The shape and size of the gap does not matter so long as compensating tab T in fact compensates for the gap. To compensate, any metal portion (e.g., a small point) absent from the metal strap due to the gap appears in one or more tabs with a displacement in the column direction only. The tab need not be formed from the same material as the heat conducting straps; however, it is necessary that the tab be formed of a material with the same optical properties as the heat conducting straps. In this way, the responsivity of each column is maintained.

Heavily doped diamond or silicon carbide may be used as the material for heat and electrical conducting straps; however, aluminum is the most common material used. Similarly, an over layer in the form of an area film of undoped diamond or silicon carbide may be used to conduct heat without electrical conduction since diamond and silicon carbide films are transparent to the light being imaged, are good thermal conductors and are poor electrical conductors.

Alternatively, the poly-crystalline silicon gates may be replaced with an optically transparent material with greater electrical and thermal conductivity to provide similar heat removal capability and operational speed. Suitable materials include indium tin oxide.

Since metal or other heat conducting straps may express greater reflectivity to the light being imaged than the reflectivity of the photo-sensitive pixels, it is preferred to coat the straps with an anti-reflective coating to reduce secondary reflections being imaged and generally improve the quality of the image.

Having described preferred embodiments of novel CCD structure with diagonal heat conducting strapping (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims:

1. A CCD structure comprising:
   a substrate having a plurality of buried channels defined therein, a first channel defining a channel direction; and
   a heat conductor disposed transversely to the buried channels and defining a longitudinal direction, the heat conductor including a first segment and a second segment separated by a gap from the first segment, the heat conductor further including a tab connected to the first segment.

2. The structure of claim 1, wherein the tab is characterized by an extent along a direction parallel to the longitudinal direction that is equal to an extent of the gap along the longitudinal direction.

3. The structure of claim 1, wherein the tab is characterized by an extent along a direction perpendicular to the longitudinal direction that is equal to a width of the heat conductor.

4. The structure of claim 1, wherein the tab is characterized by:
   an extent along a direction parallel to the longitudinal direction that is equal to an extent of the gap along the longitudinal direction;
   an extent along a direction perpendicular to the longitudinal direction that is equal to a width of the heat conductor; and
   a parallelogram shape.

5. The structure of claim 1, wherein:
   the gap is characterized by a gap predetermined shape;
   the tab is characterized by a tab predetermined shape; and
   the tab predetermined shape is equal to the gap predetermined shape.

6. The structure of claim 1, wherein:
   the gap is characterized by a gap predetermined size;
   the tab is characterized by a tab predetermined size; and
   the tab predetermined size is equal to the gap predetermined size.

7. The structure of claim 1, wherein:
   the gap is characterized by a gap predetermined orientation;
   the tab is characterized by a tab predetermined orientation; and
   the tab predetermined orientation is equal to the gap predetermined orientation.

8. The structure of claim 1, wherein:
   the gap is characterized by a gap predetermined shape, size and orientation;
   the tab is characterized by a tab predetermined shape, size and orientation; and
   the tab predetermined shape, size and orientation is equal to the gap predetermined shape, size and orientation, respectively.

9. The structure of claim 1, wherein a point in the tab is displaced from a corresponding point in the gap by a displacement in the channel direction.

10. The structure of claim 1, wherein:
    an inclination angle is defined between the channel direction and the longitudinal direction;
    the heat conductor is characterized by a width in a direction perpendicular to the longitudinal direction; and
    a point in the tab is displaced from a corresponding point in the gap by a displacement equal to the width multiplied by a secant of the inclination angle.

11. The structure of claim 1, wherein:
    an inclination angle is defined between the channel direction and the longitudinal direction;
    the heat conductor is characterized by a width in a direction perpendicular to the longitudinal direction; and
    a point in the tab is displaced from a corresponding point in the gap by a displacement in the channel direction equal to the width multiplied by a secant of the inclination angle.

12. The structure of claim 1, wherein:
    the gap includes a first gap area and a second gap area; and
    the tab is a divided tab that includes a first tab area and a second tab area.

13. The structure of claim 12, wherein the first tab area is characterized by an extent along a direction parallel to the longitudinal direction that is equal to an extent of the gap along the longitudinal direction.

14. The structure of claim 12, wherein:
    the first gap area is characterized by a first gap extent in a direction perpendicular to the longitudinal direction; and the first tab area is characterized by an extent along a direction perpendicular to the longitudinal direction that is equal to the first gap extent.

15. The structure of claim 12, wherein the first gap area is characterized by a first gap extent in a direction perpendicular to the longitudinal direction and the tab is characterized by:

an extent along a direction parallel to the longitudinal direction that is equal to an extent of the gap along the longitudinal direction;

an extent along a direction perpendicular to the longitudinal direction that is equal to the first gap extent; and a parallelogram shape.

16. The structure of claim 12, wherein:

the first gap area is characterized by a first gap predetermined shape;

the first tab area is characterized by a first tab predetermined shape; and the first tab predetermined shape is equal to the first gap predetermined shape.

17. The structure of claim 12, wherein:

the first gap area is characterized by a first gap predetermined size;

the first tab area is characterized by a first tab predetermined size; and the first tab predetermined size is equal to the first gap predetermined size.

18. The structure of claim 12, wherein:

the first gap area is characterized by a first gap predetermined orientation, the first tab area is characterized by a first tab predetermined orientation; and the first tab predetermined orientation is equal to the first gap predetermined orientation.

19. The structure of claim 12, wherein:

the first gap area is characterized by a first gap predetermined shape, size and orientation;

the first tab area is characterized by a first tab predetermined shape, size and orientation; and the first tab predetermined shape, size and orientation is equal to the first gap predetermined shape, size and orientation, respectively.

20. The structure of claim 12, wherein a point in the first tab area is displaced from a corresponding point in the first gap area by a displacement in the channel direction.

21. The structure of claim 12, wherein:

an inclination angle is defined between the channel direction and the longitudinal direction;

the first gap area is characterized by a first gap extent in a direction perpendicular to the longitudinal direction; and a point in the first tab area is displaced from a corresponding point in the first gap area by a displacement equal to the first gap extent multiplied by a secant of the inclination angle.

22. The structure of claim 12, wherein:

an inclination angle is defined between the channel direction and the longitudinal direction;

the first gap area is characterized by a first gap extent in a direction perpendicular to the longitudinal direction; and a point in the first tab area is displaced from a corresponding point in the first gap area by a displacement in the channel direction equal to the the first gap extent multiplied by a secant of the inclination angle.

23. A method of forming a CCD structure comprising steps of:

in a substrate forming a plurality of buried channels, a first channel defining a channel direction; and forming a heat conductor disposed transversely to the buried channels and defining a longitudinal direction, the heat conductor including a first segment and a second segment separated by a gap from the first segment, the heat conductor further including a tab connected to the first segment.

24. The method of claim 23, wherein the tab is characterized by an extent along a direction parallel to the longitudinal direction that is equal to an extent of the gap along the longitudinal direction.

25. The method of claim 23, wherein the tab is formed to be characterized by an extent along a direction perpendicular to the longitudinal direction that is equal to a width of the heat conductor.

26. The method of claim 23, wherein the tab is formed to be characterized by:

an extent along a direction parallel to the longitudinal direction that is equal to an extent of the gap along the longitudinal direction;

an extent along a direction perpendicular to the longitudinal direction that is equal to a width of the heat conductor; and a parallelogram shape.

27. The method of claim 23, wherein:

the gap is characterized by a gap predetermined shape;

the tab is formed to be characterized by a tab predetermined shape; and the tab predetermined shape is equal to the gap predetermined shape.

28. The method of claim 23, wherein:

the gap is characterized by a gap predetermined size;

the tab is formed to be characterized by a tab predetermined size; and the tab predetermined size is equal to the gap predetermined size.

29. The method of claim 23, wherein:

the gap is characterized by a gap predetermined orientation;

the tab is formed to be characterized by a tab predetermined orientation; and the tab predetermined orientation is equal to the gap predetermined orientation.

30. The method of claim 23, wherein:

the gap is characterized by a gap predetermined shape, size and orientation;

the tab is formed to be characterized by a tab predetermined shape, size and orientation; and the tab predetermined shape, size and orientation is equal to the gap predetermined shape, size and orientation, respectively.

31. The method of claim 23, wherein the tab is formed so that a point in the tab is displaced from a corresponding point in the gap by a displacement in the channel direction.

32. The method of claim 23, wherein:

an inclination angle is defined between the channel direction and the longitudinal direction;

the heat conductor is formed to be characterized by a width in a direction perpendicular to the longitudinal direction; and the tab is formed so that a point in the tab is displaced from a corresponding point in the gap by a displacement equal to the width multiplied by a secant of the inclination angle.

33. The method of claim 23, wherein:

an inclination angle is defined between the channel direction and the longitudinal direction;

the heat conductor is formed to be characterized by a width in a direction perpendicular to the longitudinal direction; and the tab is formed so that a point in the tab is displaced from a corresponding point in the gap by a displacement in the channel direction equal to the width multiplied by a secant of the inclination angle.

34. The structure of claim 23, wherein:

the gap includes a first gap area and a second gap area; and the tab is formed to be a divided tab that includes a first tab area and a second tab area.

* * * * *